United States Patent
Borisov et al.

(10) Patent No.: US 9,654,017 B2
(45) Date of Patent: May 16, 2017

(54) STRUCTURAL FRAME COOLING MANIFOLD

(71) Applicant: JOHNSON CONTROLS TECHNOLOGY COMPANY, Holland, MI (US)

(72) Inventors: Konstantin Borisov, York, PA (US); Mark A. Nielsen, New Freedom, PA (US); Jeffrey A. Martinelli, Middletown, PA (US); Brian L. Stauffer, York, PA (US); Seth K. Gladfelter, York, PA (US); Michael S. Todd, Jacobus, PA (US); Ivan Jadric, York, PA (US); Jeb W. Schreiber, Stewartstown, PA (US); Tim Beckley, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 0 days.

(21) Appl. No.: 14/962,148

(22) Filed: Dec. 8, 2015

(65) Prior Publication Data
US 2016/0165762 A1    Jun. 9, 2016

Related U.S. Application Data

(60) Provisional application No. 62/088,730, filed on Dec. 8, 2014.

(51) Int. Cl.
H05K 7/20 (2006.01)
H02M 5/40 (2006.01)

(52) U.S. Cl.
CPC .......... *H02M 5/40* (2013.01); *H05K 7/20927* (2013.01)

(58) Field of Classification Search
CPC . G06F 1/181–1/182; H05K 7/20218–7/20381;
(Continued)

(56) References Cited

U.S. PATENT DOCUMENTS

| 6,160,696 A | 12/2000 | Bailey et al. |
| 2001/0030881 A1 | 10/2001 | Yamaguchi et al. |

(Continued)

FOREIGN PATENT DOCUMENTS

| DE | 4225675 A1 | 2/1994 |
| EP | 0767601 A1 | 4/1997 |

*Primary Examiner* — Anthony Haughton
*Assistant Examiner* — Razmeen Gafur
(74) *Attorney, Agent, or Firm* — Fletcher Yoder, P.C.

(57) ABSTRACT

A variable speed drive includes a converter connected to an AC power source, a DC link connected to the converter, and an inverter connected to the DC link. The inverter converts DC voltage into an output AC power having a variable voltage and frequency. The inverter includes at least one power electronics module and associated control circuitry; a heat sink in thermal communication with the power electronics module and in fluid communication with a manifold. The manifold includes a tubular member having at least one vertical member portion and at least one horizontal member portion in fluid communication. A plurality of ports conduct cooling fluid into and out of the manifold. A bracket attaches the manifold to a structural frame. Brackets are provided for attachment of power electronics modules to the manifold.

20 Claims, 8 Drawing Sheets

(58) Field of Classification Search
CPC ................... H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2001/0036061 A1* | 11/2001 | Donahoe | ............... | G06F 1/203 361/679.46 |
| 2002/0135981 A1* | 9/2002 | Pautsch | ............... | H01L 23/4735 361/700 |
| 2004/0062006 A1* | 4/2004 | Pfeifer | ............... | F28F 3/12 361/699 |
| 2005/0207134 A1* | 9/2005 | Belady | ............... | H05K 1/14 361/796 |
| 2006/0082970 A1* | 4/2006 | Walz | ............... | H05K 7/20645 361/699 |
| 2006/0126295 A1* | 6/2006 | Tilton | ............... | H01L 23/4735 361/699 |
| 2008/0212282 A1* | 9/2008 | Hall | ............... | G06F 1/20 361/701 |
| 2008/0310113 A1* | 12/2008 | Renders | ............... | H05K 7/1424 361/702 |
| 2009/0073658 A1* | 3/2009 | Balcerak | ............... | H01F 27/10 361/701 |
| 2009/0115491 A1* | 5/2009 | Anwar | ............... | B60L 3/12 327/512 |
| 2009/0231811 A1* | 9/2009 | Tokuyama | ............... | H01L 23/36 361/699 |
| 2009/0262501 A1* | 10/2009 | Claassen | ............... | G06F 1/20 361/701 |
| 2010/0071396 A1* | 3/2010 | Jadric | ............... | H05K 7/20936 62/259.2 |
| 2010/0157531 A1* | 6/2010 | Mason | ............... | H01Q 1/02 361/697 |
| 2010/0245179 A1* | 9/2010 | Puzella | ............... | H01Q 1/02 343/702 |
| 2010/0246117 A1* | 9/2010 | Brunschwiler | ............... | G06F 1/20 361/679.53 |
| 2010/0277868 A1* | 11/2010 | Beaupre | ............... | H01L 23/473 361/700 |
| 2010/0309630 A1* | 12/2010 | Jones | ............... | H01L 23/467 361/694 |
| 2010/0321896 A1* | 12/2010 | Yamada | ............... | H05K 7/1432 361/718 |
| 2011/0026225 A1 | 2/2011 | Ostwald et al. | | |
| 2012/0026691 A1* | 2/2012 | Campbell | ............... | H05K 7/20781 361/700 |
| 2012/0327602 A1* | 12/2012 | Kulkarni | ............... | H02M 7/003 361/700 |
| 2012/0327603 A1* | 12/2012 | Beaupre | ............... | H01L 23/473 361/702 |
| 2013/0050944 A1* | 2/2013 | Shepard | ............... | H01L 23/473 361/703 |
| 2013/0094139 A1* | 4/2013 | Campbell | ............... | H05K 7/20772 361/679.47 |
| 2013/0322016 A1* | 12/2013 | Jones | ............... | H05K 7/1432 361/689 |

\* cited by examiner

STRUCTURAL FRAME COOLING MANIFOLD

BACKGROUND

The application generally relates to a cooling manifold for a variable speed drive. The application relates more specifically to a structural frame cooling manifold for a variable speed drive.

Electrical panels that house power switching devices generate significant heat that must be removed so that the electronic components do not fail due to overtemperature. Electrical panels used in applications such as variable speed drives used in motor control and HVAC applications have typically used hoses for coolant distribution and steel members for structural support.

The present disclosure discloses a single part that functions as both a cooling fluid manifold and a structural member. Hoses may fail and cause liquid to contact energized components or buses inside the electrical gear, causing short circuits or equipment shutdowns. The disclosed arrangement eliminates or minimizes the use of hoses and provides cooling passages integrated with structural members that support the electrical cabinet and electronic components mounted within the cabinet.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to a variable speed drive includes a converter connected to an AC power source, a DC link connected to the converter, and an inverter connected to the DC link, the inverter configured to convert a DC voltage from the DC link into an output AC power having a variable voltage and a variable frequency, the inverter further comprising: at least one power electronics module and associated control circuitry; a nonconductive heat sink in thermal communication with the power electronics module and in fluid communication with a manifold, the manifold comprising a hollow tubular member, a plurality of ports for conducting a cooling fluid into and from the tubular member, at least one bracket for attachment of the manifold to a structural frame, and at least one bracket for attachment of the at least one power electronics module to the tubular member. In an exemplary embodiment the tubular member includes at least one vertical member portion in fluid communication with at least one horizontal member portion.

Another embodiment relates to a manifold including a hollow tubular member having at least one vertical member portion and at least one horizontal member portion in fluid communication, a plurality of ports for conducting a cooling fluid into and from the manifold, at least one bracket for attachment of the manifold to a structural frame, and at least one bracket for attachment of a power electronics module to the manifold.

Certain advantages of the embodiments described herein include a structural frame for a VSD that includes a manifold. The manifold may be constructed of hollow stainless steel tubing for circulating a liquid coolant. The manifold provides distribution ports for connection to VSD cooling blocks. The manifold reduces complexity of the distribution of cooling fluid in the VSD, through minimization of the hoses within the VSD. The manifold also provides structural support for components in the VSD. Reduces complexity of the cooling system design through minimization of the hoses in the liquid cooled VSDs. Any non-corrosive material may be used for the manifold tubing, or to coat the manifold tubing to prevent corrosion, e.g., non-corrosive metal, ceramic or polymer materials.

Alternative exemplary embodiments relate to other features and combinations of features as may be generally recited in the claims.

DETAILED DESCRIPTION OF THE EXEMPLARY EMBODIMENTS

Figure 1:
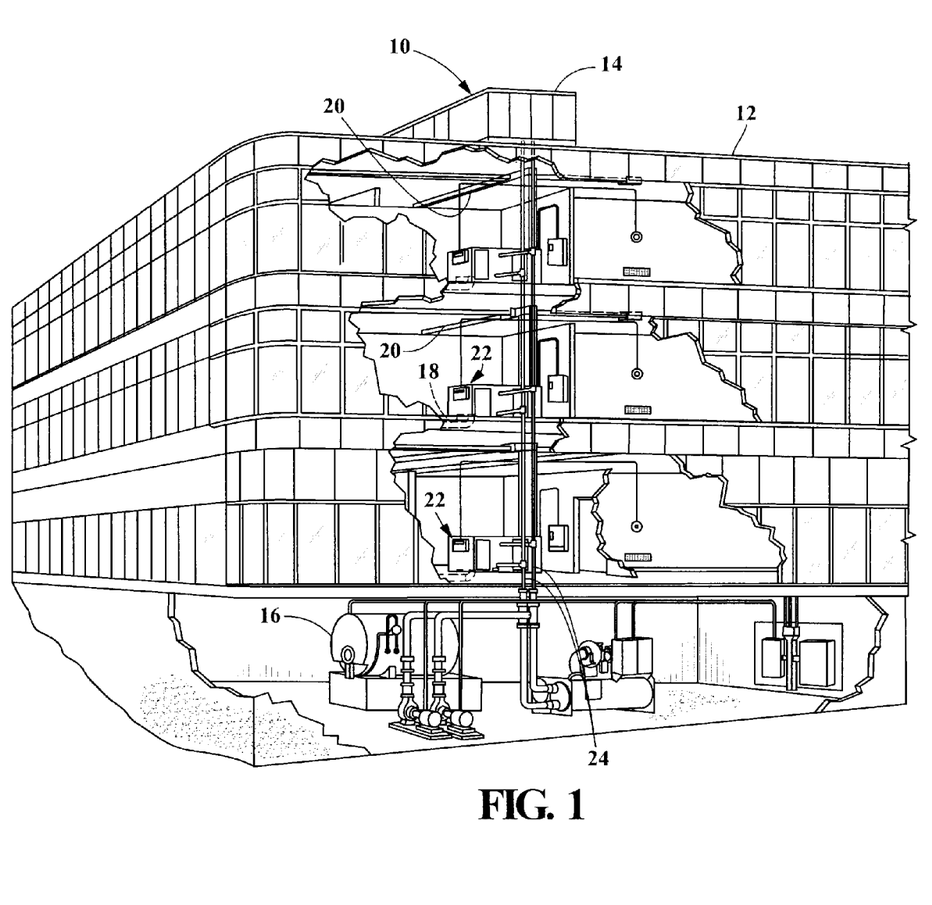
FIG. 1 shows an exemplary embodiment of a Heating, Ventilation, Air Conditioning and Refrigeration (HVAC&R) system in a commercial environment.

FIG. 1 shows an exemplary environment for a Heating, Ventilating, Air Conditioning system (HVAC system) 10 in a building 12 for a typical commercial setting. System 10 may include a compressor incorporated into a vapor compression system 14 that can supply a chilled liquid that may be used to cool building 12. System 10 can also include a boiler 16 to supply a heated liquid that may be used to heat building 12, and an air distribution system that circulates air through building 12. The air distribution system can include an air return duct 18, an air supply duct 20 and an air handler 22. Air handler 22 can include a heat exchanger that is connected to boiler 16 and vapor compression system 14 by conduits 24. The heat exchanger in air handler 22 may receive either heated liquid from boiler 16 or chilled liquid from vapor compression system 14 depending on the mode of operation of system 10. System 10 is shown with a separate air handler on each floor of building 12, but it will be appreciated that these components may be shared between or among floors.

Figure 2:
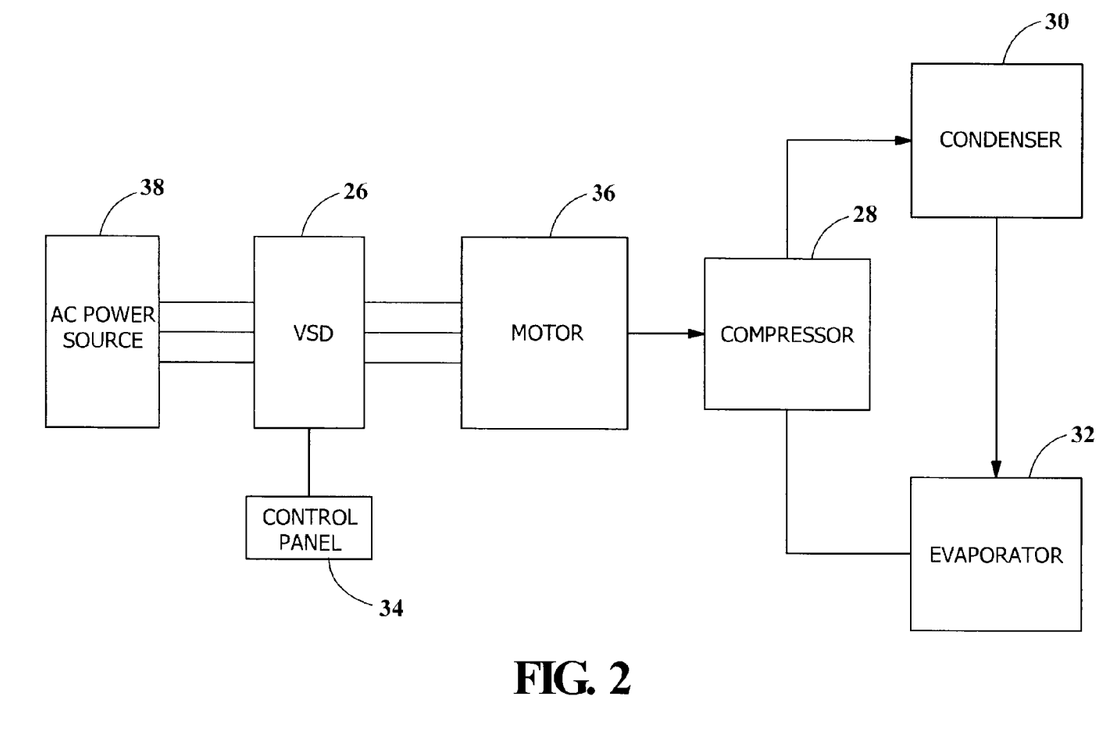
FIG. 2 schematically illustrates an exemplary embodiment of a vapor compression system that may be used in the exemplary embodiment of FIG. 1.

FIG. 2 schematically illustrates an exemplary embodiment of vapor compression system 14 with VSD 26 that may be used in building 12 in FIG. 1. Vapor compression system 14 may include compressor 28, a condenser 30, a liquid chiller or evaporator 32 and a control panel 34. Compressor 28 is driven by motor 36 that is powered by VSD 26. VSD 26 receives AC power having a particular fixed line voltage and fixed line frequency from AC power source 38 and provides AC power to motor 36 at desired voltages and desired frequencies, both of which can be varied to satisfy particular requirements. Control panel 34 can include a variety of different components such as an analog to digital (A/D) converter, a microprocessor, a non-volatile memory, and an interface board, to control operation of vapor compression system 14. Control panel 34 can also be used to control the operation of VSD 26, and motor 36.

Compressor 28 compresses a refrigerant vapor and delivers the vapor to condenser 30 through a discharge line. Compressor 28 can be any suitable type of compressor, for example, a screw compressor, a centrifugal compressor, a reciprocating compressor, a scroll compressor, etc. The refrigerant vapor delivered by compressor 28 to condenser 30 enters into a heat exchange relationship with a fluid, for example, air or water, and undergoes a phase change to a refrigerant liquid as a result of the heat exchange relationship with the fluid. The condensed liquid refrigerant from condenser 30 flows through an expansion device (not shown) to evaporator 32.

Evaporator 32 may include connections for a supply line and a return line of a cooling load. A process fluid, for example, water, ethylene glycol, calcium chloride brine or sodium chloride brine, travels into evaporator 32 via return line and exits evaporator 32 via supply line. The liquid refrigerant in evaporator 32 enters into a heat exchange relationship with the process fluid to lower the temperature of the process fluid. The refrigerant liquid in evaporator 32 undergoes a phase change to a refrigerant vapor as a result of the heat exchange relationship with the process fluid. The vapor refrigerant in evaporator 32 exits evaporator 32 and returns to compressor 28 by a suction line to complete the cycle.

Figure 3:
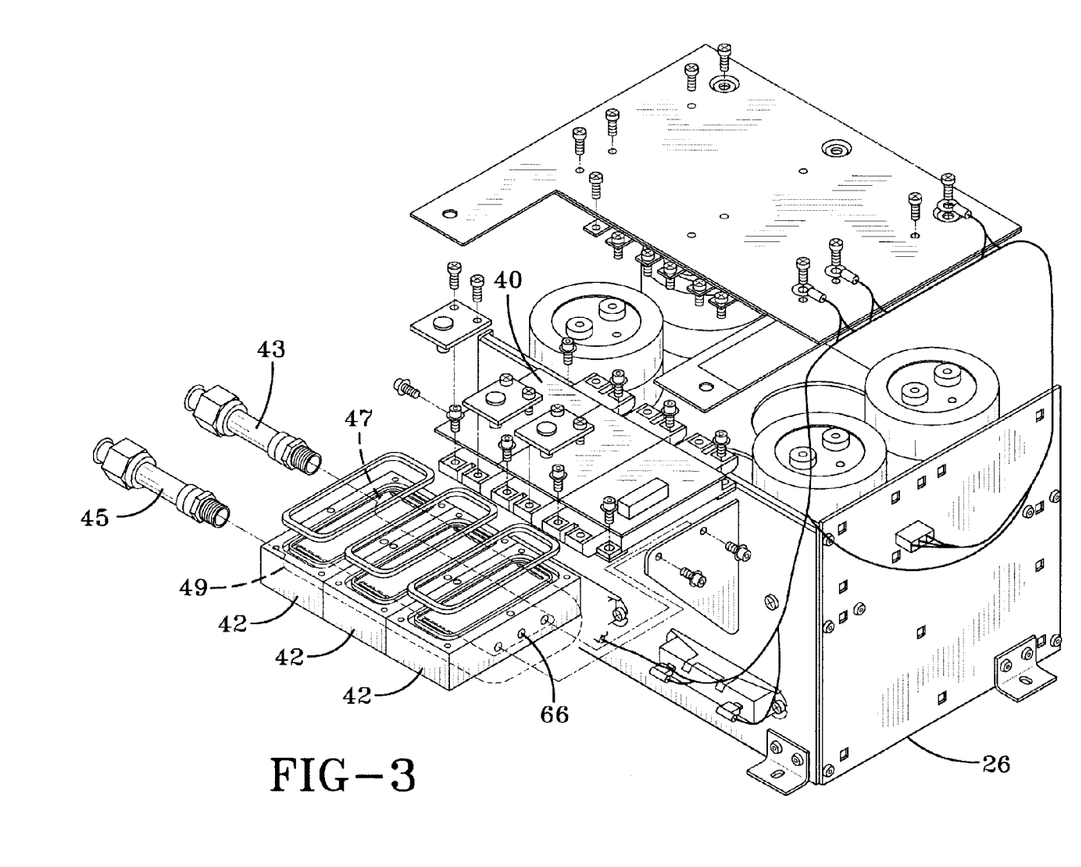
FIG. 3 shows an exploded view of a portion of a variable speed drive system with an exemplary embodiment of a cooling member.

FIG. 3 shows one part of a variable speed drive 26 with a plurality of switches 40 that are placed over cooling members 42. VSD 26 may be used to provide desired power to motors for different applications or HVAC systems. For example, such a motor may drive a compressor of a vapor compression system. Switches 40 of the VSD 26 are depicted as an Infineon module with 3 dual IGBT's, but other semiconductor devices or other electronic components that require cooling may be cooled with cooling members 42. Pipes 43, 45 are connected to inlet passageway 47 and outlet passageway 49, respectively to introduce cooling fluid into and remove cooling fluid from cooling members 42. Pipes 43 and 45 or other suitable flow passages are connected to a cooling system, which provides a continuous flow of cooling fluid to cooling members 42. A cooling fluid is applied to pipe 43, flows through the member 42, and flows out through pipe 45.

A variety of different cooling fluids, including condensed water, water, and known refrigerants can be circulated in cooling members 42 and used to cool the electronic components. In addition, a variety of different cooling systems can be used to cool the cooling fluid that exits from cooling members 42.

Cooling members 42 cool modules in a VSD 26 used to power a motor of an HVAC system. The modules can be connected to cooling member 42 in a sealed relationship. The cooling fluid applied to cooling member 42 can be water that flows through cooling member 42 and a heat exchanger in a closed loop. The heat exchanger cools the water before it is reintroduced to cooling member 42. The heat exchanger can be a shell and tube type heat exchanger and water from a cooling tower of the HVAC system can be used to cool the water applied to cooling member 42.

Figure 4:
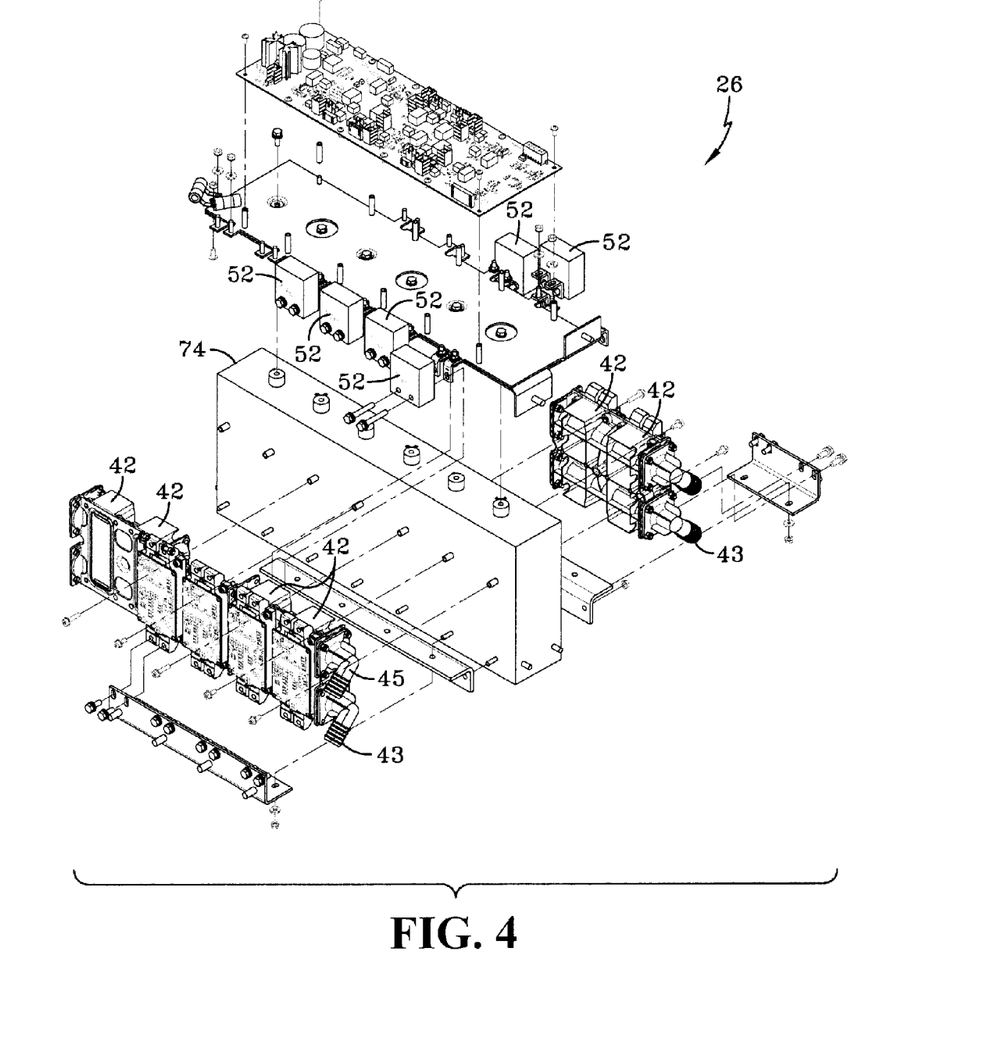
FIG. 4 shows a plurality of cooling members located on a power electronics assembly in an exemplary embodiment.

FIG. 4 shows a plurality of cooling members 42 to be mounted to a component of VSD 26. Cooling members 42 are positioned vertically and mounted on the side of components 74 (for example, dc link capacitors). In another embodiment, components 74 may be oriented in any suitable orientation, such as, vertical, horizontal, or diagonal.

Figure 5:
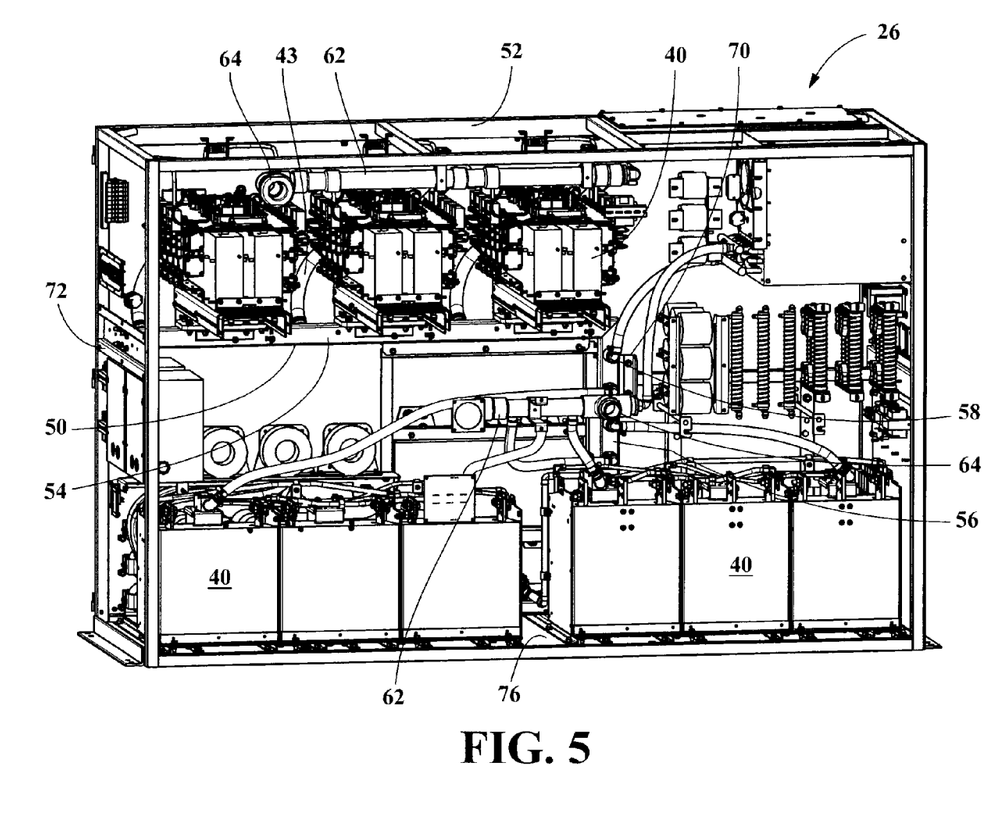
FIG. 5 shows an elevation view of an exemplary view of the internal components enclosed in the VSD.
Figure 6:
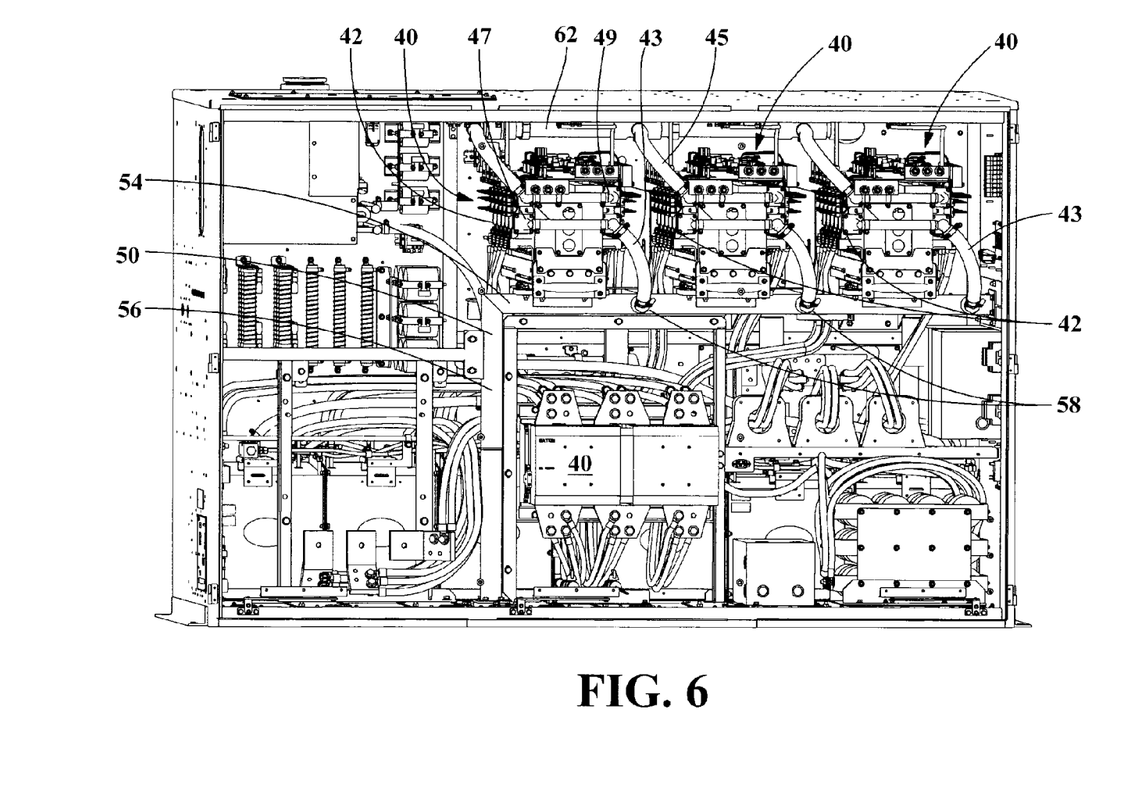
FIG. 6 shows an opposite side view of the internal components shown in FIG. 5.

Referring next to FIGS. 5 and 6, an elevation view of an exemplary view of the internal components enclosed in the VSD 26 is shown. A manifold 50 is mounted within a frame 52 of VSD 26. Manifold 50 includes a horizontal tubular member 54 and a vertical tubular member 56 connected at a 90° angle, the horizontal tubular member 54 and vertical tubular member 56 in fluid communication for flow of cooling fluid to supply couplings or ports 58. Supply ports 58 are connected in flow communication with inlet passageways 47 of cooling members 42 through hose sections 43, to provide cooling fluid to cooling members 42 mounted on switches 40. After the cooling fluid circulates through cooling members 42, cooling fluid exits cooling members 42 through outlet passageways 49 and flows into a return conduit 62, and exits VSD 26 at discharge ports 64 in flow communication with conduit 62. At least one supply port 58 is designated as an inlet port connected to a source (not shown) for receiving cooling fluid into manifold 50.

Figure 7:
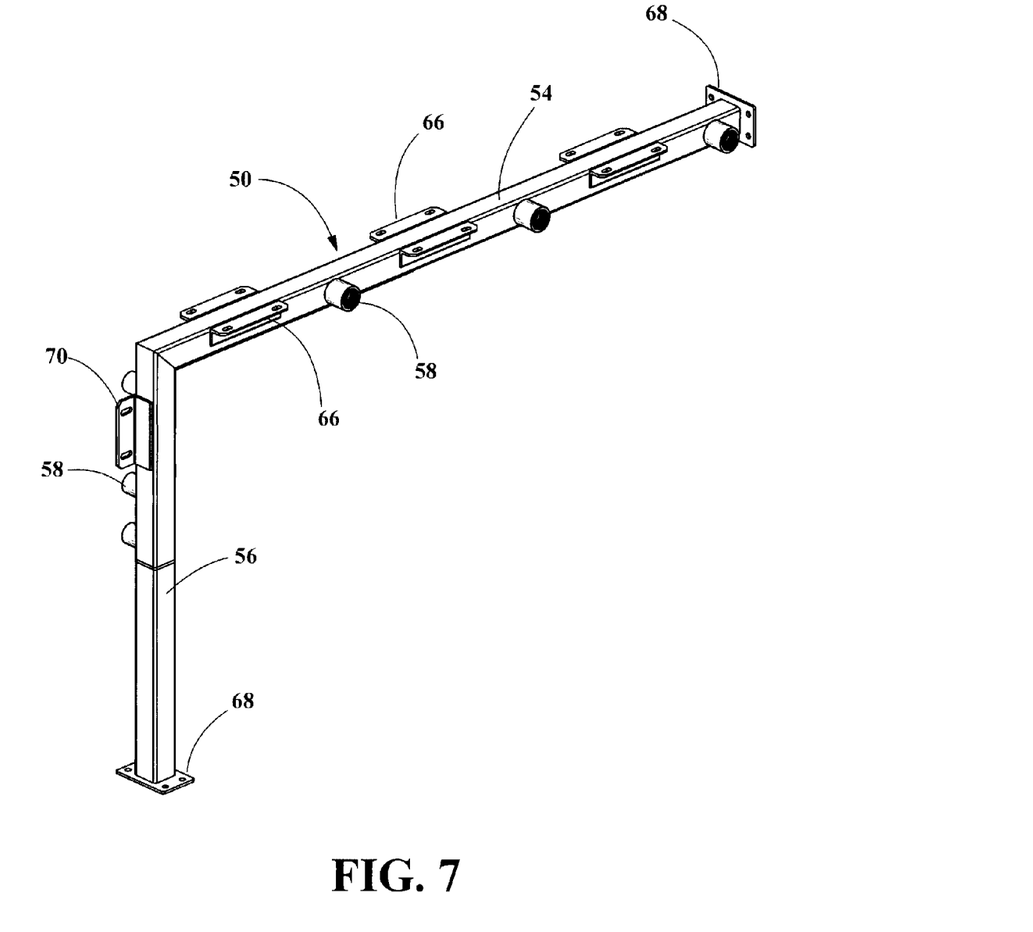
FIG. 7 shows a perspective view of an exemplary cooling manifold.
Figure 8:
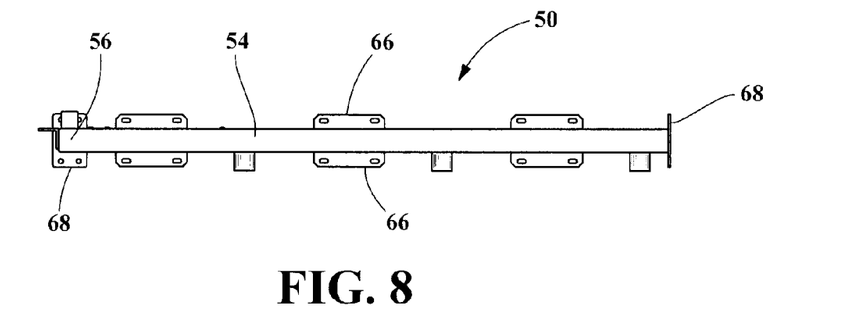
FIG. 8 shows a plan view of the cooling manifold of FIG. 7.
Figure 9:
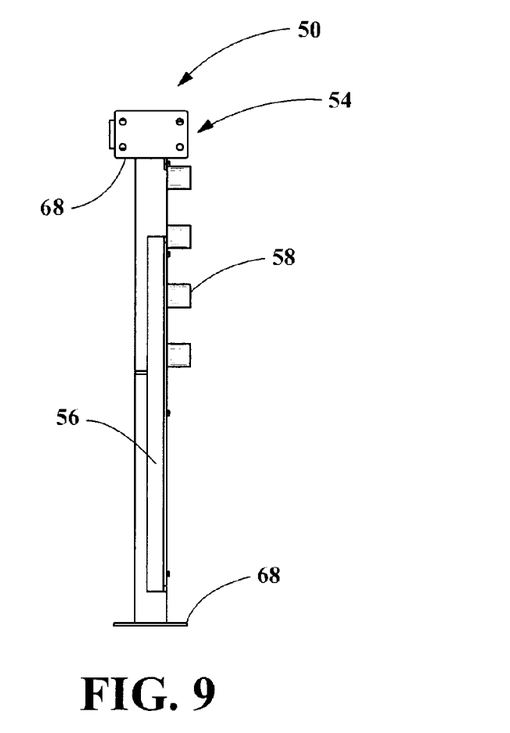
FIG. 9 shows an end view of the cooling manifold of FIG. 7.

Referring to FIGS. 7-9, an exemplary cooling manifold 50 is shown. A plurality of ports 58 are located along horizontal manifold section 54 and vertical manifold section 56. The number and location of ports 58 may vary depending on the application, e.g., the number of switches 40 and their locations within frame 52. Angle brackets 66 are provided along horizontal manifold section 54 for attachment of switches 40. End brackets 68 are located at a distal end of horizontal and vertical manifold sections 54, 56 for attachment to frame section 52 at an end panel 72 and a base 76, respectively. An auxiliary angle bracket 70 may also be attached to manifold 50 adjacent the intersection of vertical manifold section 56 with horizontal manifold section 58 for connecting manifold 50 to internal frame members 78.

Manifold 50 provides structural support to the frame 52 and switches 40 while using the same space as a conduit for cooling fluid. The dual purpose manifold provides additional useful space within the VSD 26 and reduces the amount of hose needed to connect cooling members 42 with a source of cooling fluid.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the variable speed drive as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. A variable speed drive system configured to receive as an input AC power at a fixed AC input voltage magnitude and frequency and provide an output AC power at a variable voltage and a variable frequency, the variable speed drive system comprising:
   a converter adapted to be coupled to an AC power source providing the input AC voltage, the converter being configured to convert the input AC voltage to a DC voltage;
   a DC link connected to the converter, the DC link being configured to filter the DC voltage and to store energy from the converter; and
   an inverter connected to the DC link, the inverter being configured to convert the DC voltage from the DC link into the output AC power having the variable voltage and the variable frequency, the inverter comprising:
   at least one power electronics module and associated circuitry;
   a heat sink in thermal communication with the power electronics module and in cooling fluid communication with a manifold, the manifold including a hollow tubular member having at least one port for conducting the cooling fluid into the manifold and at least one port for conducting the cooling fluid out of the manifold, at least one bracket for attaching the manifold to a structural frame of the power electronics and at least one bracket for attaching a power electronics module to the manifold, whereby the manifold provides a dual function of providing structural support for the frame and support for the electronic module while simultaneously providing a conduit for the cooling fluid using the same space.

2. The variable speed drive system of claim 1, wherein the manifold further comprises at least one vertical member portion in fluid communication with at least one horizontal member portion.

3. The variable speed drive system of claim 2, wherein the at least one power electronics module is mounted on the horizontal member portion.

4. The variable speed drive system of claim 1, wherein the manifold is fabricated from a non-corrosive material.

5. The variable speed drive system of claim 4, wherein the non-corrosive material is stainless steel.

6. The variable speed drive system of claim 1, wherein the manifold is coated with a material selected from the group consisting of polymers and ceramic.

7. The variable speed drive system of claim 1, wherein the manifold further comprises end brackets for mounting the manifold to the frame.

8. A variable speed drive system configured to receive as an input AC power at a fixed AC input voltage magnitude and frequency and provide an output AC power at a variable voltage and a variable frequency, the variable speed drive system comprising:
   a converter adapted to be coupled to an AC power source providing the input AC voltage, the converter being configured to convert the input AC voltage to a DC voltage;
   a DC link connected to the converter, the DC link being configured to filter the DC voltage and to store energy from the converter; and
   an inverter connected to the DC link, the inverter being configured to convert the DC voltage from the DC link into the output AC power having the variable voltage and the variable frequency, the inverter comprises:
   a plurality of power electronics modules and associated circuitry;
   a heat sink in thermal communication with each of the power electronics modules and in fluid communication with a manifold, the manifold including a cavity through which a cooling medium passes, at least one port for conducting the cooling medium into the manifold cavity and at least one port for conducting the cooling medium out of the manifold cavity, a bracket for attaching the manifold to a structural frame of the power electronics, and a bracket for attaching each of the power electronics modules to the manifold, whereby the manifold provides a dual function of providing structural support for the frame and support for the electronic modules while simultaneously providing a conduit for the cooling fluid using the same space.

9. The variable speed drive system of claim 8, wherein the manifold further comprises at least one vertical member portion in fluid communication with at least one horizontal member portion.

10. The variable speed drive system of claim 9, wherein at least one of the power electronics modules is mounted on the horizontal member portion.

11. The variable speed drive system of claim 8, wherein the manifold is fabricated from a non-corrosive material.

12. The variable speed drive system of claim 11, wherein the non-corrosive material is stainless steel.

13. The variable speed drive system of claim 8, wherein the manifold is coated with a material selected from the group consisting of polymers and ceramic.

14. The variable speed drive system of claim 8, wherein the manifold further comprises end brackets for mounting the manifold to the frame.

15. A cooling system for heat generating electronics enclosed within a housing, the electronics having at least one power electronics module and associated circuitry, the cooling system comprising:
   a heat sink in thermal communication with the power electronics module and in cooling fluid communication with a manifold, the manifold including a hollow tubular member having at least one port for conducting cooling fluid into the manifold and at least one port for conducting cooling fluid out of the manifold, at least one bracket for attaching the manifold to a structural frame of the power electronics, at least one bracket for attaching the manifold to a structural frame, and a plurality of brackets for attaching power electronics modules to the manifold, whereby the manifold provides a dual function of structural support for the frame and the electronic module while simultaneously providing a conduit for the cooling fluid using the same space.

16. The cooling system of claim 15 wherein the manifold further comprises at least one vertical member portion in fluid communication with at least one horizontal member portion.

17. The cooling system of claim 16, wherein the at least one power electronics module is mounted on the horizontal member portion.

18. The cooling system of claim 15, wherein the manifold is fabricated from a non-corrosive material.

19. The cooling system of claim 18, wherein the non-corrosive material is stainless steel.

20. The cooling system of claim 15, wherein the manifold further comprises end brackets for mounting the manifold to the frame.

\* \* \* \* \*